(12) United States Patent
Xiang et al.

(10) Patent No.: US 6,437,404 B1
(45) Date of Patent: Aug. 20, 2002

(54) SEMICONDUCTOR-ON-INSULATOR TRANSISTOR WITH RECESSED SOURCE AND DRAIN

(75) Inventors: Qi Xiang, San Jose; Wei Long, Sunnyvale; Ming-Ren Lin, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/636,239

(22) Filed: Aug. 10, 2000

(51) Int. Cl.[7] .................. H01L 27/01; H01L 27/12; H01L 31/0392
(52) U.S. Cl. .................. 257/347; 257/349; 257/382
(58) Field of Search .................. 257/347, 349, 257/375, 382, 408; 438/149, 479, 517

(56) References Cited

U.S. PATENT DOCUMENTS

| | | | |
|---|---|---|---|
| 5,264,395 A | | 11/1993 | Bindal et al. |
| 5,444,282 A | * | 8/1995 | Yamaguchi et al. ......... 257/344 |
| 5,510,640 A | * | 4/1996 | Shindo ......... 257/347 |
| 5,656,844 A | | 8/1997 | Klein et al. |
| 5,930,642 A | * | 7/1999 | Moore et al. ......... 438/407 |
| 5,994,191 A | | 11/1999 | Xiang et al. |
| 6,015,752 A | | 1/2000 | Xiang et al. |
| 6,064,092 A | * | 5/2000 | Park ......... 257/347 |

FOREIGN PATENT DOCUMENTS

| | | | |
|---|---|---|---|
| JP | 401128514 A | * | 5/1989 |
| JP | 403222454 A | * | 10/1991 |
| JP | 02000150892 A | * | 5/2000 |

* cited by examiner

Primary Examiner—Olik Chaudhuri
Assistant Examiner—Hoai Pham
(74) Attorney, Agent, or Firm—Renner, Otto, Boisselle & Sklar, LLP

(57) ABSTRACT

A fully-depleted semiconductor-on-insulator (SOI) transistor device has an SOI substrate with a buried insulator layer having a nonuniform depth relative to a top surface of the substrate, the buried insulator layer having a shallow portion closer to the top surface than deep portions of the layer. A gate is formed on a thin semiconductor layer between the top surface and the shallow portion of the insulator layer. Source and drain regions are formed on either side of the gate, the source and drain regions each being atop one of the deep portions of the buried insulator layer. The source and drain regions thereby have a greater thickness than the thin semiconductor layer. Thick silicide regions formed in the source and drain regions have low parasitic resistance. A method of making the transistor device includes forming a dummy gate structure on an SOI substrate, and using the dummy gate structure to control the depth of an implantation to form the nonuniform depth buried insulator layer.

28 Claims, 5 Drawing Sheets

SEMICONDUCTOR-ON-INSULATOR TRANSISTOR WITH RECESSED SOURCE AND DRAIN

BACKGROUND OF THE INVENTION

1. Technical Field of the Invention

The invention relates generally to semiconductor-on-insulator devices and methods for forming the same. The invention relates particularly to semiconductor-on-insulator transistors which operate in a fully-depleted mode.

2. Background of the Art

Semiconductor-on-insulator (SOI) transistor devices are typically formed using silicon and generally operate in either a partially-depleted mode or a fully-depleted mode. SOI devices operating in a fully-depleted mode offer good short channel control by having only a thin semiconductor (silicon) film underneath a gate electrode. The thinness of the film physically restrains the short channel effects. In order to achieve this effect, the semiconductor film thickness under the gate may be less than about ⅓ of the gate length. Fully-depleted SOI transistors may also have other advantages over partially-depleted SOI transistors, such as lower subthreshold leakage and more convenient source and drain formation.

However, fully-depleted SOI transistors tend to have high parasitic resistance. This is because of the thin silicon film used in fully-depleted SOI transistors leads to thin silicide formations on the source and drain of the transistors. The thin silicide regions have high electrical resistance, which leads to degraded device performance. The trend toward reduced gate sizes exacerbates the parasitic resistance problem for fully-depleted SOI transistors.

From the foregoing it will be appreciated that a need exists for a fully-depleted SOI transistor which lessens or avoids the high parasitic resistance problem described above.

SUMMARY OF THE INVENTION

A fully-depleted semiconductor-on-insulator (SOI) transistor device has an SOI substrate with a buried insulator layer having a nonuniform depth relative to a top surface of the substrate, the buried insulator layer having a shallow portion closer to the top surface than deep portions of the layer. A gate is formed on a thin semiconductor layer between the top surface and the shallow portion of the insulator layer. Source and drain regions are formed on either side of the gate, the source and drain regions each being atop one of the deep portions of the buried insulator layer. The source and drain regions thereby have a greater thickness than the thin semiconductor layer. Thick silicide regions formed in the source and drain regions have low parasitic resistance. A method of making the transistor device includes forming a dummy gate structure on an SOI substrate, and using the dummy gate structure to control the depth of an implantation to form the nonuniform depth buried insulator layer.

According to aspect of the invention, a fully-depleted SOI transistor device has an SOI substrate with a buried insulator layer having a nonuniform depth relative to a top surface of the substrate.

According to another aspect of the invention, an SOI transistor device includes an SOI substrate with a buried insulator layer having a shallow portion which is closer to a surface of the substrate than are deep portions of the buried insulator layer. The transistor device includes a gate atop the shallow portion, with a semiconductor layer therebetween.

According to yet another aspect of the invention, a fully-depleted SOI transistor device includes source and drain regions which are thicker than a semiconductor region beneath a gate.

According to still another aspect of the invention, a fully-depleted SOI transistor device includes a gate, and silicide regions on opposite sides of the gate, the suicide regions having a maximum thickness which is greater than a thickness of a semiconductor region beneath a gate.

According to a further aspect of the invention, a method of forming an SOI substrate with a buried insulator layer which is a nonuniform distance from a top surface of the substrate, includes the steps of forming a structure on the top surface, and implanting ions through the top surface. The resulting buried insulator layer has a shallow portion, relatively close to the top surface, in the vicinity of the structure, and deep portions, relatively far from the top surface, away from the structure.

According to another aspect of the invention, a semiconductor-on-insulator transistor device includes a silicon-on-insulator substrate having a top surface, the substrate including a buried insulator layer and a semiconductor layer, the buried insulator layer having a shallow portion and deep portions, wherein the shallow portion is closer to the top surface than deep portions, and the semiconductor layer being atop the shallow portion; and a gate atop the semiconductor layer.

According to yet another aspect of the invention, a method for manufacturing a semiconductor-on-insulator transistor device, includes the steps of: forming a buried insulator layer having a nonuniform depth relative to a top surface of a semiconductor-on-insulator substrate, the buried insulator layer having a shallow portion closer to the top surface than deep portions of the buried insulator layer; and forming a gate on the substrate over the shallow portion, a semiconductor layer of the substrate thereby being between the gate and the shallow portion.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
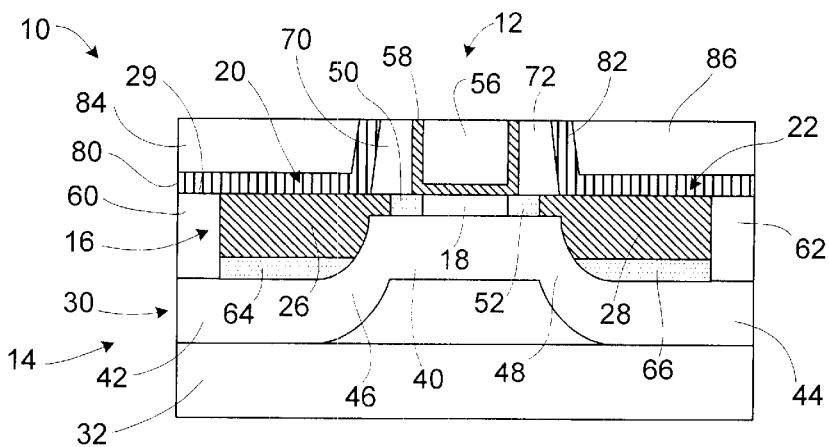
FIG. 1 is a side sectional view showing a semiconductor-on-insulator (SOI) transistor device embodying the present invention.

Referring initially to FIG. 1, a semiconductor-on-insulator (SOI) transistor device 10 has a gate 12 atop a substrate 14. The substrate 14 has a surface semiconductor layer 16 which has nonuniform thickness, so as to allow the transistor to operate in fully-depleted mode, while reducing or eliminating the effects of parasitic resistance. Thus the semiconductor layer includes a thin semiconductor film channel region 18 beneath the gate 12, and source and drain regions 20 and 22 on respective sides of the channel region 18. The source and drain regions 20 and 22 have at least portions that are thicker than the channel region 18. Source and drain silicide regions 26 and 28 are at least partially within the source and drain regions 20 and 22, respectively. The silicide regions 26 and 28, having a thickness greater than that of the channel region 18, have a lower electrical resistance than they would if they had the same thickness as the thin channel region. The silicide regions 26 and 28 have surfaces along a top surface 29 of the substrate 14, to enable external electrical connection of the silicide regions by conventional means.

A buried insulator layer 30 separates the surface semiconductor layer 16 from a bulk semiconductor region 32. The buried insulator layer 30 has a nonuniform depth beneath the top surface 29 of the substrate 14. Thus the buried insulator layer 30 has a shallow portion 40 beneath the thin channel region 18, and deep portions 42 and 44 beneath the thicker portions of the source and drain regions 20 and 22, respectively. The shallow portion 40 may be wider than the gate 12, and may be a substantially uniform distance from the top surface 29. The buried insulator layer also includes transition portions 46 and 48 between the shallow portion 40 and the deep portions 42 and 44, respectively. The transition portions 46 and 48 may have a curved shape. The buried insulator layer 30 may have a substantially uniform thickness.

The surface semiconductor layer 16 and the bulk semiconductor region 32 may include any of a variety of suitable semiconductor materials, for example silicon. The buried insulator layer 30 may be composed of silicon dioxide ($SiO_2$), although it will be appreciated that other suitable insulator materials may alternatively or in addition may be employed.

The source and drain regions 20 and 22 have opposite conductivity from the thin channel region 18. For example, the source and drain regions 20 and 22 may have N-type conductivity, with the channel region 18 having P-type conductivity. Alternatively, the source and drain regions 20 and 22 may have P-type conductivity, with the channel region 18 having N-type conductivity.

The source and drain regions 20 and 22 have respective source and drain extensions 50 and 52, which extend partially underneath the gate 12. The gate 12 includes a gate electrode 56, and a gate dielectric 58 partially around the gate electrode. The gate electrode 56 may be a metal gate electrode. Alternatively, the gate electrode may be any of a wide variety of gate electrode materials and/or designs, for example including polysilicon. The gate dielectric 58 may be formed of a conventional material such as silicon dioxide, silicon oxynitride, or silicon nitride ($Si_3N_4$). The source region 20, the drain region 22, and the channel region 18 are operatively configured with the gate 12 to form a transistor such as a metal oxide semiconductor field effect transistor (MOSFET).

The substrate 14 includes insulator-filled trenches 60 and 62 electrically isolating the source and drain regions 20 and 22, respectively, for example from similar regions in other adjacent transistors (not shown). An exemplary insulator material in the insulator-filled trenches 60 and 62 is silicon dioxide.

The silicide regions 26 and 28 do not extend fully down to the buried insulator layer 30—strips 64 and 66 of the source and drain regions 20 and 22 are between the respective silicide regions 26 and 28 and the deep portions 42 and 44 of the buried insulator layer. However, it will be appreciated that the silicide regions 26 and 28 may be extended to the buried insulator layer 30, if so desired.

The transistor device 10 includes spacers 70 and 72 atop the top surface 29 of the substrate 14, on either side of the gate 12. The spacers 70 and 72 may be formed of an insulator material, such as silicon dioxide. The device 10 also includes etch stop layers 80 and 82, and layers of filler 84 and 86. The etch stop layers 80 and 82 may include silicon nitride ($Si_3N_4$), and the layers of filler 84 and 86 may include silicon dioxide, although in both instances it will be appreciated that other suitable materials may be used.

It will be appreciated that the transistor described above may operate as a fully-depleted transistor. Thus the gate 12 may have a length of 25–100 nm and the thin channel region 18 may have a thickness of 500–5000 Angstroms. The thickness of the thin channel region 18 may be less than or equal to approximately ⅓ the length of the gate 12. Further, the channel region 18 may have a substantially-uniform thickness. The maximum thickness of the silicide regions 26 and 28 may be 200–800 Angstroms. The buried insulator layer 30 may have a thickness of 1000–3000 Angstroms. The relatively-thin channel region 18 may allow the transistor to operate in a fully-depleted mode, thus allowing the SOI transistor device to have the advantageous characteristics of a fully-depleted transistor. In addition, the relatively-thick silicide regions 26 and 28 (at least thicker than the channel region 18) results in reduced parasitic resistance.

It will be appreciated that the transistor described above may be just one of a plurality of transistor devices on a single semiconductor device. Such transistors may be combined with a wide variety of other structures, for example in multiple layers, to form an integrated circuit.

It will further be appreciated that suitable modifications may be made to the SOI transistor device 10 described above. For example, it will be appreciated that silicide regions 26 and 28 may alternatively or in addition include other electrically-conducting materials, such as other semiconductor-metal compounds. As another example, it will be appreciated that insulator material of the insulator-filled trenches 60 and 62 may be formed other than by trenching and filling.

Figure 2:
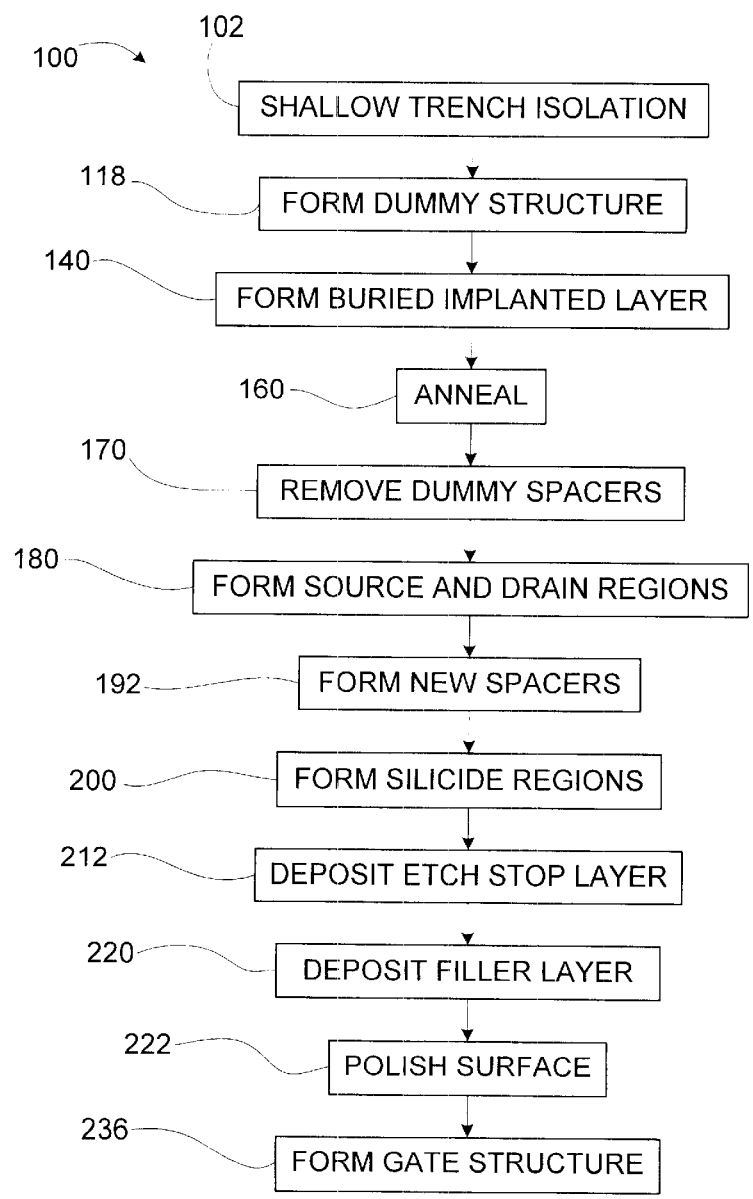
FIG. 2 is a flow chart illustrating a method of manufacturing an SOI transistor device such as the device of FIG. 1.
Figure 3:
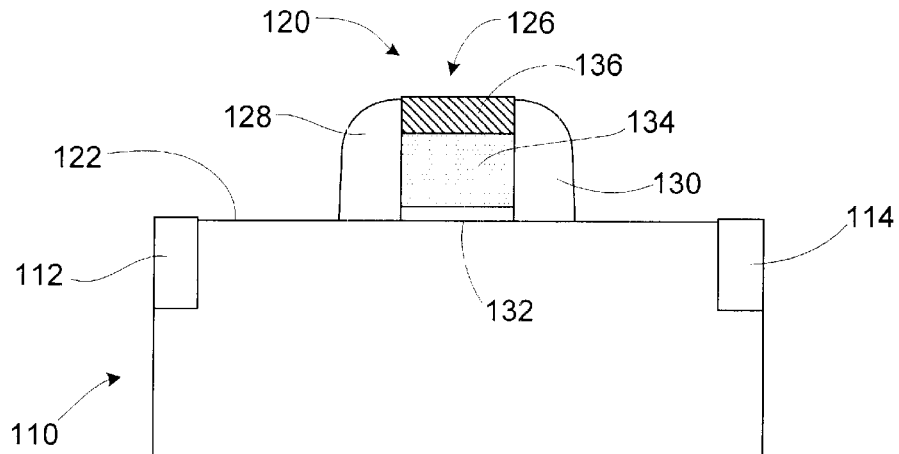
FIGS. 3–12 are side sectional views illustrating various steps of the method of FIG. 2.

FIG. 2 is a flow chart of a method 100 for forming an SOI transistor device such as the SOI transistor device 10 shown in FIG. 1 and described above. In step 102 of the method 100, a wafer (substrate) 110 of semiconductor material is trenched and filled to form insulator-filled trenches 112 and 114, as shown in FIG. 3. The insulator-filled trenches 112 and 114 may be formed using well-known shallow trench isolation (STI) techniques.

FIG. 3 also shows the results of step 118, wherein a dummy structure 120 is formed on a top surface 122 of the substrate 110. As explained in greater detail below, the dummy structure 120 is used for controlling the depth of an implant for forming the buried insulator layer. The dummy structure 120 includes a central portion 126, which may be a dummy gate structure, flanked by a pair of spacers 128 and 130. The central portion 126 includes a dummy gate oxide layer 132, a polysilicon dummy gate 134 and a bottom anti-reflective coating (BARC) layer 136.

The dummy gate oxide layer 132, which may for example be made of $SiO_2$, may be deposited on and/or grown on the semiconductor substrate 110. The oxide layer may have an exemplary thickness of between about 20 to 200 Angstroms, although it will be appreciated that the layer may have a different thickness. Thereafter the polysilicon dummy gate 134 may be formed by depositing a layer of polysilicon and BARC material, such as SiON, on the dummy gate oxide layer 132, and selectively removing the BARC material and polysilicon except where desired. The polysilicon may be deposited, for example, using low pressure chemical vapor deposition (LPCVD) processing techniques, at a temperature from about 500 to 650° C., to a thickness of between about 1200 to 3000 Angstroms. The deposited material may be selectively removed, for example by well-known photolithographic and selective etching methods, to form the polysilicon dummy gate 134 and the BARC layer 136 in a desired location. An example of a suitable etching method is reactive ion etching (RIE), using $Cl_2$ as an etchant. It will be appreciated that a wide variety of other suitable methods for gate formation may be employed in this step.

The dummy spacers 128 and 130, which may be made of an oxide such as $SiO_2$, may be formed by depositing a conformal $SiO_2$ layer, and then selectively removing $SiO_2$ material to form the spacers. The deposit of the dielectric material and its selective removal may be accomplished by conventional means, for example chemical vapor deposition (CVD) such as LPCVD or plasma enhanced chemical vapor deposition (PECVD), of silicon dioxide, followed by anisotropic etching using suitable, well-known etchants, an exemplary etchant being $CHF_3$.

It will be appreciated that the dummy structure 120 described above is only exemplary, and that a wide variety of suitable dummy structure materials and/or configurations may alternatively be employed.

Figure 4:
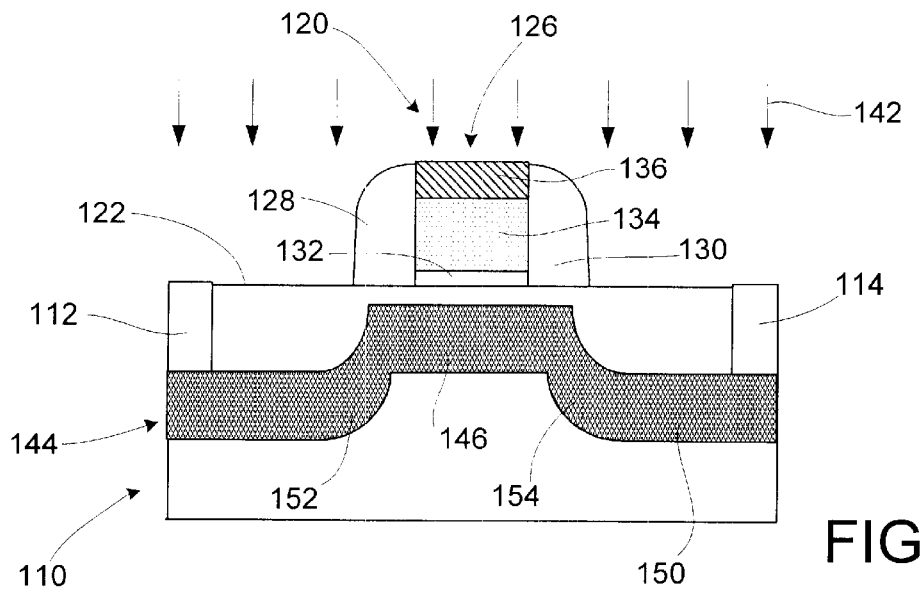

FIG. 4 illustrates the results of step 140, an oxygen ion implantation 142 to form a buried oxygen-implanted layer 144. The implantation 142 may be of ions having an energy of 100–200 keV. An exemplary range of implantation dosage for the implantation is $5 \times 10^{17}$ to $1 \times 10^{18}$ ions/cm$^2$. The buried oxygen-implanted layer has a nonuniform depth below the top surface 122 of the substrate 110, due to the presence of the dummy structure 120, which absorbs some of the penetrating power of the oxygen ions implanted therethrough. Thus the buried oxygen-implanted layer 144 has a shallow portion 146 underneath the dummy structure 120, deep portions 148 and 150 away from the dummy structure 120, and transition portions 152 and 154 between the shallow portion and the deep portions.

Figure 5:
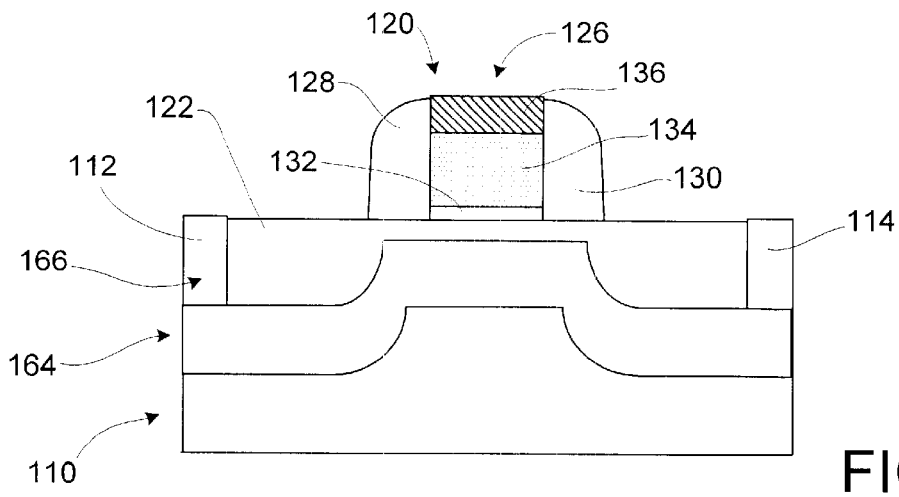

Thereafter an annealing is performed in step 160, resulting in the structure shown in FIG. 5. The annealing converts the buried oxygen-implanted layer 144 to a buried insulator layer 164, formed of $SiO_2$. The annealing also anneals out the implantation-induced damage in a shallow semiconductor layer 166 between the top surface 122 and the buried insulator layer 164. An exemplary temperature is about 1300° C., and an exemplary suitable length of time is 4 to 8 hours. It will be appreciated that other temperatures and heating times may be employed.

Figure 6:
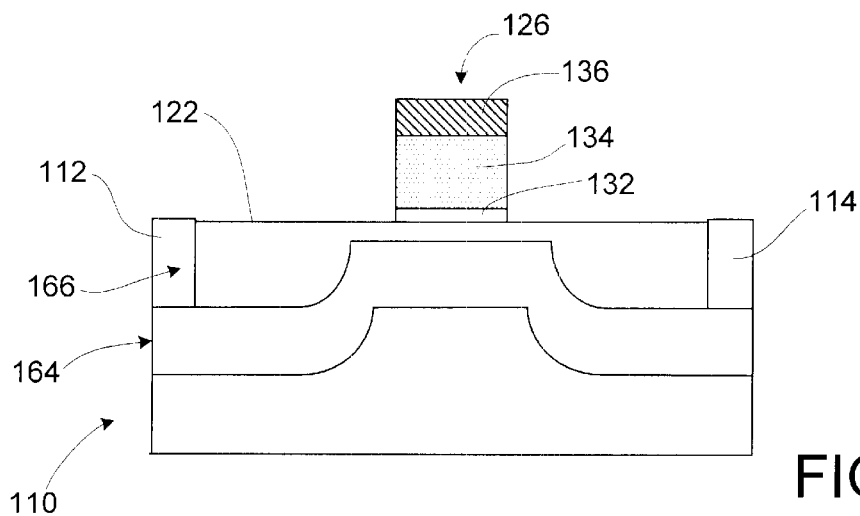
Figure 7:
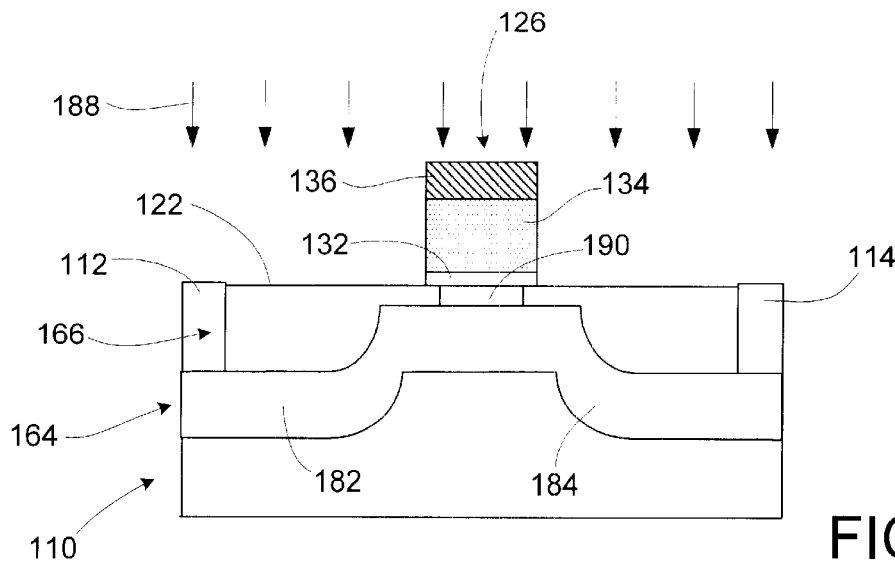

The dummy spacers 128 and 130 are removed by etching in step 170, using suitable solvents and/or techniques, leaving the structure shown in FIG. 6. Thereafter, in step 180, source and drain regions 182 and 184 are formed, as illustrated in FIG. 7. The source and drain regions 182 and 184 may be formed by a doping implantation 188, followed by a suitable annealing. It will be appreciated that suitable materials, energies, and techniques for doping and annealing to form the source and drain regions 182 and 184 are well-known in the art. For instance, boron or indium may be implanted to achieve a P-type conductivity and phosphorous or arsenic may be implanted to form an N-type conductivity. An exemplary range of concentration of these dopants is between $1 \times 10^{20}$ and $2 \times 10^{20}$ atoms/cm$^3$. The central portion 126 of the dummy structure 120 may function as a mask to prevent doping of a central thin semiconductor region 190 beneath the central portion 126.

Figure 8:
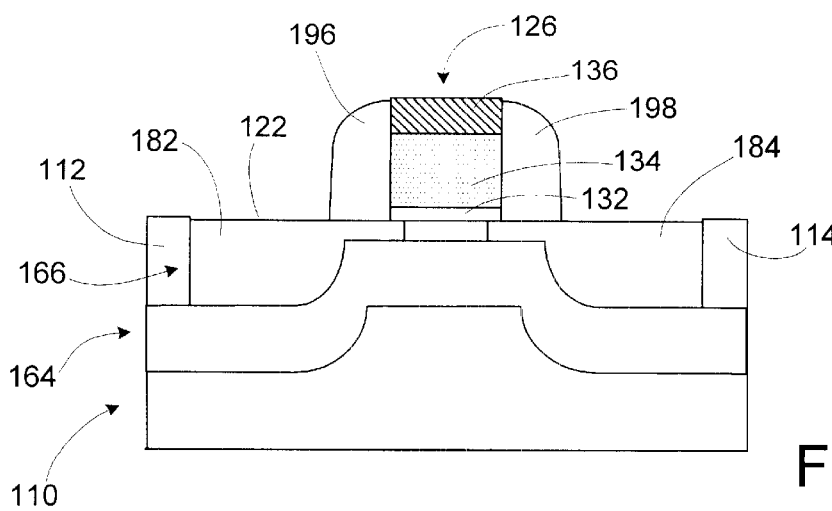

In step 194, illustrated in FIG. 8, spacers 196 and 198 are formed on opposite sides of the central portion 126 of the dummy structure 120. The process of forming the spacers 196 and 198 may be similar to that described above for forming the dummy spacers 128 and 130.

Figure 9:
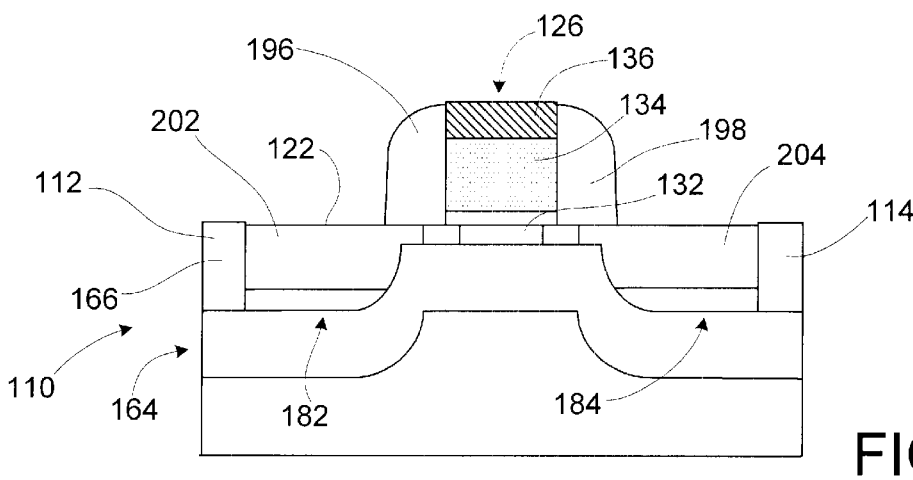

Thereafter, in step 200, source and drain silicide regions 202 and 204 are formed in the source and drain regions 182 and 184, respectively, as shown in FIG. 9. The formation of the silicide regions 202 and 204 involves depositing a layer of material on the exposed portion of the tope surface of the substrate 110, the central portion 126 of the dummy gate 120, and the spacers 196 and 198. The metal may be a metal such as titanium, cobalt, or nickel, which is suitable for forming a conducting compound, such as a silicide, with the semiconductor material. The metal layer may be deposited, for example, by sputtering.

After deposition of the metal layer, the silicide regions 202 and 204 are formed by well-known methods, an exemplary method being raising temperature of the device to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the semiconductor device to a temperature between 600 and 900° C. for about 5 to 120 seconds. It will be appreciated that other temperatures and heating times may be employed.

Figure 10:
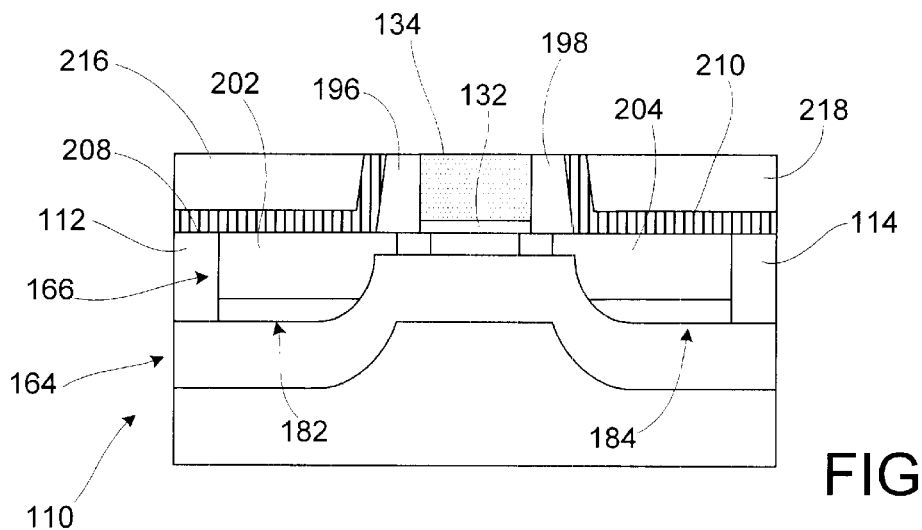
Figure 11:
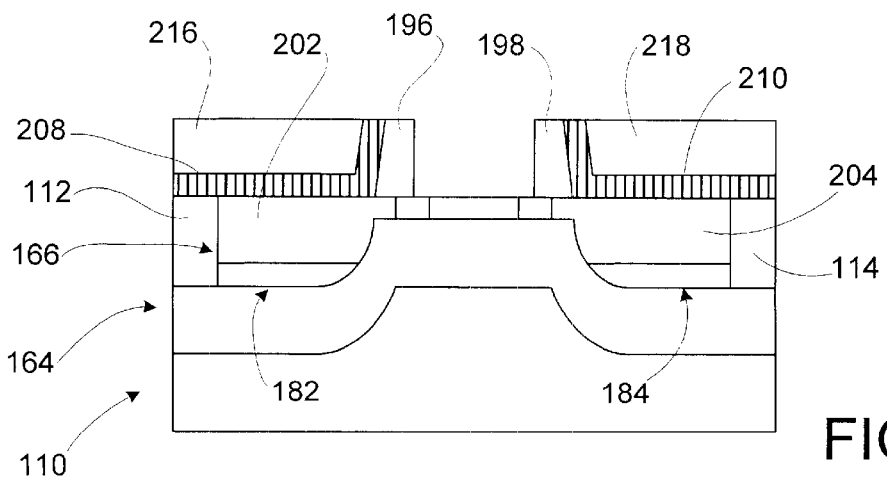

As illustrated in FIG. 10, etch stop layers 208 and 210 are deposited in step 212; filler layers 216 and 218 are deposited in step 220; and the surface of the device is polished in step 222, for example by well-known chemical mechanical polishing (CMP) techniques, to thereby remove the BARC layer 136. Thereafter, the dummy gate electrode 134 and the dummy gate oxide layer 132 are removed in step 230, illustrated in FIG. 11. The removal of the dummy gate electrode 134 and the dummy gate oxide layer 132 may be accomplished using well-known suitable etching techniques, for example.

Figure 12:
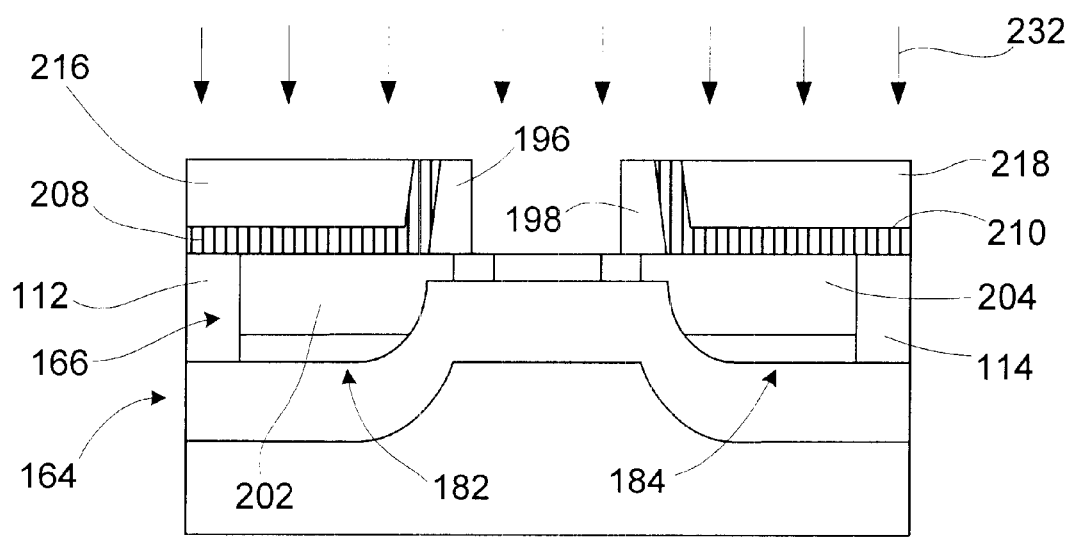

A channel implantation 232 may be performed in step 236 to suitable dope the central thin semiconductor region 190, if desired, as shown in FIG. 12. Finally, in step 240 a gate structure is formed in the location where the dummy gate electrode 134 and the dummy gate oxide layer 132 were removed in step 230. The resulting structure may be similar to the SOI transistor device shown in FIG. 1.

It will be appreciated that the above-described SOI transistor device and method of manufacture are merely exemplary, and that many variations on the above-described method may be employed to construct SOI transistor devices having some or all of the characteristics of SOI transistor device 10 described above. Where suitable, it may be possible to use different materials, implant concentrations, implant energies, and/or manufacturing techniques. In addition, it may be suitable to perform certain of the method steps in a different order. Also, it may be possible to combine method steps, add additional method steps, and/or omit certain method steps, where suitable.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor-on-insulator transistor device comprising:
    a silicon-on-insulator substrate having a top surface, the substrate including a buried insulator layer and a semiconductor layer, the buried insulator layer having a shallow portion and deep portions, wherein the shallow portion is closer to the top surface than the deep portions, and the semiconductor layer being atop the shallow portion;
    a gate atop the semiconductor layer; and
    silicide regions between the top surface and at least part of respective of the deep portions;
    wherein the semiconductor layer includes a source and a drain which are operatively coupled to the gate;
    wherein the silicide regions include a source silicide region operatively coupled to the source, and a drain silicide region operatively coupled to the drain; and
    wherein the silicide regions are at least partially in contact with the deep portions.

2. A semiconductor-on-insulator transistor device comprising:
    a silicon-on-insulator substrate having a top surface, the substrate including a buried insulator layer and a semiconductor layer, the buried insulator layer having a shallow portion and deep portions, wherein the shallow portion is closer to the top surface than the deep portions, and the semiconductor layer being atop the shallow portion;
    a gate atop the semiconductor layer; and
    silicide regions between the top surface and at least part of respective of the deep portions;
    wherein the semiconductor layer includes a source and a drain which are operatively coupled to the gate;
    wherein the silicide regions include a source silicide region operatively coupled to the source, and a drain silicide region operatively coupled to the drain; and
    wherein the source and drain silicide regions are at least partially atop the shallow portion.

3. The transistor device of claim 2, further comprising a buried semiconductor region at least partially between one of the silicide regions and a corresponding of the deep portions.

4. The transistor device of claim 2, wherein the silicide regions each have a maximum thickness of at least 200 Angstroms.

5. The transistor device of claim 2, wherein the semiconductor layer has a thickness of between 500 and 5000 Angstroms.

6. The transistor device of claim 2, wherein the semiconductor layer has a thickness less than about ⅓ of a length of the gate.

7. The transistor device of claim 2, wherein the gate includes a metal gate electrode.

8. The transistor device of claim 2, wherein the semiconductor layer includes a fully depleted channel region.

9. The transistor device of claim 2, wherein the shallow portion is wider than the gate.

10. The transistor device of claim 2, wherein the buried insulator layer is a buried oxide layer.

11. The transistor device of claim 10, wherein the semiconductor layer is a silicon layer and the buried oxide layer is a buried silicon oxide layer.

12. The transistor device of claim 10, wherein the buried insulator layer is a continuous layer.

13. The transistor device of claim 10, wherein the buried insulator layer includes transition portions between the shallow portion and the deep portions.

14. The transistor device of claim 13, wherein the transition portions each have a curved shape.

15. The transistor device of claim 13, wherein the source and drain silicide portions are in contact with respective of the transition portions.

16. The transistor device of claim 2, wherein the buried insulator layer has substantially uniform thickness.

17. The transistor device of claim 2, wherein the shallow portion is substantially parallel to the top surface, the semiconductor layer thereby having a substantially uniform thickness.

18. The transistor device of claim 2, wherein the source and drain silicide portions are in contact with the shallow portion of the buried insulator layer.

19. The transistor device of claim 2, wherein the source and the drain include respective source and drain extensions, and wherein the source and drain extensions are in contact with the shallow portion of the buried insulator layer.

20. A semiconductor-on-insulator transistor device comprising:
    a silicon-on-insulator substrate having a top surface, the substrate including a buried insulator layer and a semiconductor layer, the buried insulator layer having a shallow portion and deep portions, wherein the shallow portion is closer to the top surface than the deep portions, and the semiconductor layer being atop the shallow portion;
    a gate atop the semiconductor layer; and
    a source silicide region operatively coupled to the source, and a drain silicide region operatively coupled to the drain;
    wherein the semiconductor layer includes a source and a drain which are operatively coupled to the gate;
    wherein the source and the drain include respective source and drain extensions, and wherein the source and drain extensions are in contact with the shallow portion of the buried insulator layer;
    wherein the suicide regions are atop the shallow portion of the buried insulator layer; and
    wherein the suicide regions are in contact with the shallow portion.

21. The transistor device of claim 20, wherein the buried insulator layer includes transition portions between the shallow portion and the deep portions.

22. The transistor device of claim 21, wherein the silicide regions are atop respective of the transition portions.

23. The transistor device of claim 20, wherein the semiconductor layer includes a fully depleted channel layer.

24. A semiconductor-on-insulator transistor device comprising:

a silicon-on-insulator substrate having a top surface, the substrate including a buried insulator layer and a semiconductor layer, the buried insulator layer having a shallow portion and deep portions, wherein the shallow portion is closer to the top surface than the deep portions, and the semiconductor layer being atop the shallow portion;

a gate atop the semiconductor layer; and a source silicide region operatively coupled to the source, and a drain silicide region operatively coupled to the drain;

wherein the semiconductor layer includes a source and a drain which are operatively coupled to the gate;

wherein the source and the drain include respective source and drain extensions, and wherein the source and drain extensions are in contact with the shallow portion of the buried insulator layer;

wherein the silicide regions are atop the shallow portion of the buried insulator layer;

wherein the buried insulator layer includes transition portions between the shallow portion and the deep portions;

wherein the silicide regions are atop respective of the transition portions; and wherein the silicide regions are in contact with respective of the transition portions.

25. The transistor device of claim 24, wherein the transition portions each have a curved shape.

26. The transistor device of claim 25, wherein the silicide regions are in contact with the shallow portion.

27. The transistor device of claim 26, wherein the semiconductor layer includes a fully depleted channel layer.

28. The transistor device of claim 26, wherein the buried insulator layer includes a semiconductor oxide.

* * * * *

UNITED STATES PATENT AND TRADEMARK OFFICE
CERTIFICATE OF CORRECTION

PATENT NO. : 6,437,404 B1
DATED : August 20, 2002
INVENTOR(S) : Xiang et al

It is certified that error appears in the above-identified patent and that said Letters Patent is hereby corrected as shown below:

Column 2,
Line 7, replace "suicide" with -- silicide --

Signed and Sealed this

Twenty-eighth Day of January, 2003

JAMES E. ROGAN
*Director of the United States Patent and Trademark Office*